(12) United States Patent
Liang et al.

(10) Patent No.: US 9,544,408 B2
(45) Date of Patent: Jan. 10, 2017

(54) WEARABLE ELECTRONIC DEVICE

(71) Applicant: Quanta Computer Inc., Taoyuan (TW)

(72) Inventors: Yuan-Chen Liang, Taoyuan (TW);
Cheng-Hao Wu, Taoyuan (TW);
Chi-Cheng Wu, Taoyuan (TW);
Hsuan-Hao Hsu, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 14/865,445

(22) Filed: Sep. 25, 2015

(65) Prior Publication Data
US 2016/0366256 A1    Dec. 15, 2016

(30) Foreign Application Priority Data

Jun. 10, 2015    (TW) .............................. 104209274 U

(51) Int. Cl.
*H04M 1/00*    (2006.01)
*H04M 1/21*    (2006.01)
*H05K 7/02*    (2006.01)
*H05K 5/04*    (2006.01)

(52) U.S. Cl.
CPC ................. *H04M 1/21* (2013.01); *H05K 5/04* (2013.01); *H05K 7/02* (2013.01)

(58) Field of Classification Search
CPC ................................ H01Q 1/273; G04G 17/06
USPC ...... 343/718, 702, 895, 720, 357.55; 607/60; 600/479
See application file for complete search history.

(56) References Cited

U.S. PATENT DOCUMENTS

| | | | | |
|---|---|---|---|---|
| 5,465,098 | A * | 11/1995 | Fujisawa | H01Q 13/10 343/718 |
| 2009/0121931 | A1* | 5/2009 | Katz | B63C 9/0005 342/357.55 |
| 2011/0102274 | A1* | 5/2011 | Fujisawa | G04G 5/002 343/702 |
| 2013/0182382 | A1* | 7/2013 | Vardi | G08B 13/1463 361/679.01 |
| 2013/0231574 | A1* | 9/2013 | Tran | A61B 5/0022 600/479 |

* cited by examiner

*Primary Examiner* — Kiet Doan
(74) *Attorney, Agent, or Firm* — Rabin & Berdo, P.C.

(57) ABSTRACT

A wearable electronic device includes a device body having a wireless communication module, a wearing unit connected to the device body for being worn on a user, an antenna module entirely embedded inside the wearing unit, and a conductive unit is partially disposed in the wearing unit and electrically connected to the antenna module and the wireless communication module.

11 Claims, 5 Drawing Sheets

ABLE ELECTRONIC DEVICE

RELATED APPLICATIONS

This application claims priority to Taiwan Application Serial Number 104209274, filed Jun. 10, 2015, which is herein incorporated by reference.

BACKGROUND

Field of Disclosure

The present disclosure relates to an electronic device. More particularly, the present disclosure relates to a wearable electronic device.

Description of Related Art

With the development of electronic and wireless communication technology, an electronic device is integrated with a normal wearable unit to be a wearable electronic device for being worn on or carried with a user's body. The wearable electronic device, for example, can present in a form of a wristband, a card hanger, a pair of glasses or a headphone etc. The wearable electronic device is provided with an antenna module, and the antenna module is installed in a main housing (e.g., caliber) of the wearable electronic device for exchanging electric data or signals with an external device.

However, in practice, since the main housing (e.g., caliber) of the wearable electronic device unavoidably has metallic decorative pieces thereon, the antenna module installed in the main housing (e.g., caliber) can be interfered with or shielded by the metallic decorative pieces so as to degrade the expected antenna efficiency of the antenna module. As a result, not only the total data transmission performance of the wearable electronic device is reduced, but also the anticipated capability of the antenna module cannot be measured correctly.

Therefore, how to provide a solution to effectively solve the aforementioned inconvenience and shortages and to increase the competitiveness of industries shall be seriously concerned.

SUMMARY

One objection of the disclosure is to provide a wearable electronic device to overcome the defects and inconvenience of the prior art.

For achieving the aforementioned objection, according to one embodiment, a wearable electronic device is provided, and the wearable electronic device includes a device body having a wireless communication module, a wearing unit connected to the device body for being worn on a user, an antenna module entirely embedded inside the wearing unit, and a conductive unit is partially disposed in the wearing unit and electrically connected to the antenna module and the wireless communication module.

Therefore, since the antenna module in the embodiment is out of the device body to be apart from the device body, so the antenna module will not be interfered or shielded by the device body so as to avoid degrading the expected antenna efficiency of the antenna module. Thus, not only the total data transmission performance of the wearable electronic device can be maintained, but also the anticipated capability of the antenna module can be measured correctly.

In one or more embodiments, the wearing unit comprises a wearing member and a connection portion connected to the wearing member and the device body. One part of the connection portion is embedded inside one end portion of the wearing member, and the other part of the connection portion is exposed outwards from the end portion of the wearing member.

In one or more embodiments, the connection portion includes a first plastic body, and the wearing member includes a second plastic body. A hardness of the first plastic body is greater than a hardness of the second plastic body.

In one or more embodiments, the wireless communication module comprises a plurality of terminals abreast arranged on the device body at intervals and exposed outwards from the device body. The conductive unit comprises a support body and a plurality of metallic elastic pieces fixed on the support body, and the metallic elastic pieces are abreast arranged on the support body at intervals. When the wearing unit is connected to the device body, each of the metallic elastic pieces elastically contacts with one of the terminals.

In one or more embodiments, the other part of the connection portion is provided with a plurality of slots abreast arranged at intervals and exposed outwards from the end portion of the wearing member. The support body is entirely embedded inside the connection portion, and the metallic elastic pieces extend outwards from the connection portion via the slots, respectively.

In one or more embodiments, the device body comprises at least one metallic shell, and the wireless communication module is disposed in the metallic shell.

In one or more embodiments, the wearable electronic device is a digital watch, a pair of glasses, a bracelet, a card hanger or a headphone.

In one or more embodiments, the wearing unit is a wrist-worn band, and the antenna module comprises an antenna unit and a flexible wired board, the antenna unit is electrically connected to the flexible wired board and the conductive unit.

In one or more embodiments, the wireless communication module is a blue-tooth wireless communication module, an infrared transmission module, a radio frequency identification (RFID) module, a WIFI network module or a near-field communication (NFC) module.

In another embodiment of the disclosure, a wearable electronic device is provided, and the wearable electronic device includes a device body, a wrist-worn band and an antenna module. The device body is provided with a wireless communication module, and the wireless communication module is provided with a first conductive interface. The wrist-worn band is detachably connected to the device body, and the wrist-worn band is provided with a second conductive interface. The antenna module is entirely embedded inside the wrist-worn band, and electrically connected to the second conductive interface. Thus, in this embodiment, when the wrist-worn band connects to the device body, the first conductive interface electrically contacts with the second conductive interface. Thus, the assembly process can be simplified, and assembly time and labor costs can be reduced.

In one or more embodiments, the wrist-worn band comprises a wearing member and a connection portion connected to the wearing member and the device body. One part of the connection portion is embedded inside one end portion of the wearing member, and the other part of the connection portion is exposed outwards from the end portion of the wearing member.

In one or more embodiments, a hardness of the connection portion is greater than a hardness of the wearing member.

In one or more embodiments, the first conductive interface comprises a plurality of terminals, and the terminals are abreast arranged on the device body at intervals, and exposed outwards from the device body. The second conductive interface comprises a plurality of metallic elastic pieces abreast arranged on the wrist-worn band at intervals. When the wrist-worn band is connected to the device body, each of the metallic elastic pieces is elastically contacted by one of the terminals.

In one or more embodiments, the other part of the connection portion is provided with a plurality of slots, the slots are abreast arranged at intervals, and exposed outwards from the end portion of the wearing member, and the metallic elastic pieces extend outwards from the connection portion via the slots, respectively.

In one or more embodiments, the device body comprises at least one metallic shell. The wireless communication module is disposed in the metallic shell, and the first conductive interface is exposed outwards from the metallic shell.

In one or more embodiments, the antenna module comprises an antenna unit and a flexible wired board, the antenna unit is electrically connected to the flexible wired board and the second conductive interface.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
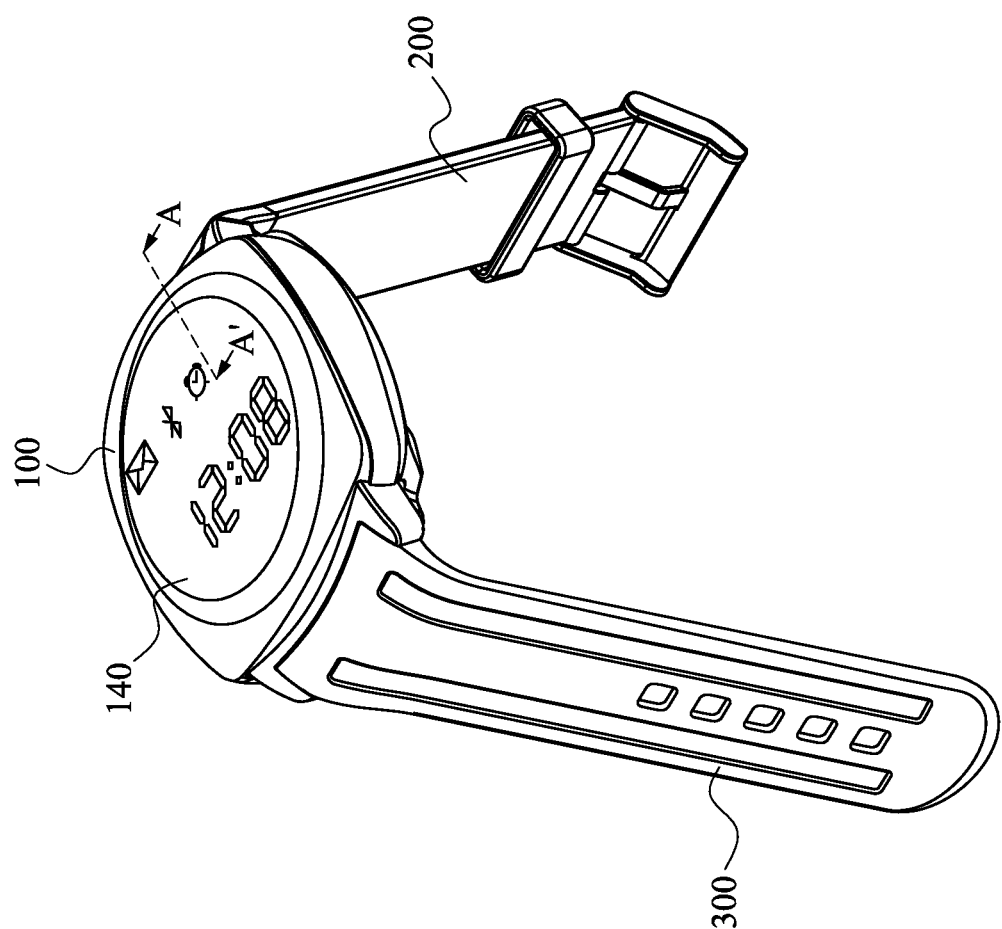
FIG. 1 is a perspective view of a wearable electronic device according to an embodiment of this disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

As the conventional antenna installed in the main housing (e.g., caliber) of the wearable electronic device is unavoidable to be interfered or shielded by the main housing (e.g., caliber) so as to degrade the expected antenna efficiency of the antenna module, according to one embodiment of the disclosure, since an antenna module of the wearable electronic device is out of a device body of the wearable electronic device to be apart from the device body, so the antenna module will not be interfered or shielded by the device body to avoid degrading the expected antenna efficiency of the antenna module. Thus, not only the total data transmission performance of the wearable electronic device can be maintained, but also the anticipated capability of the antenna module can be measured correctly.

Figure 2:
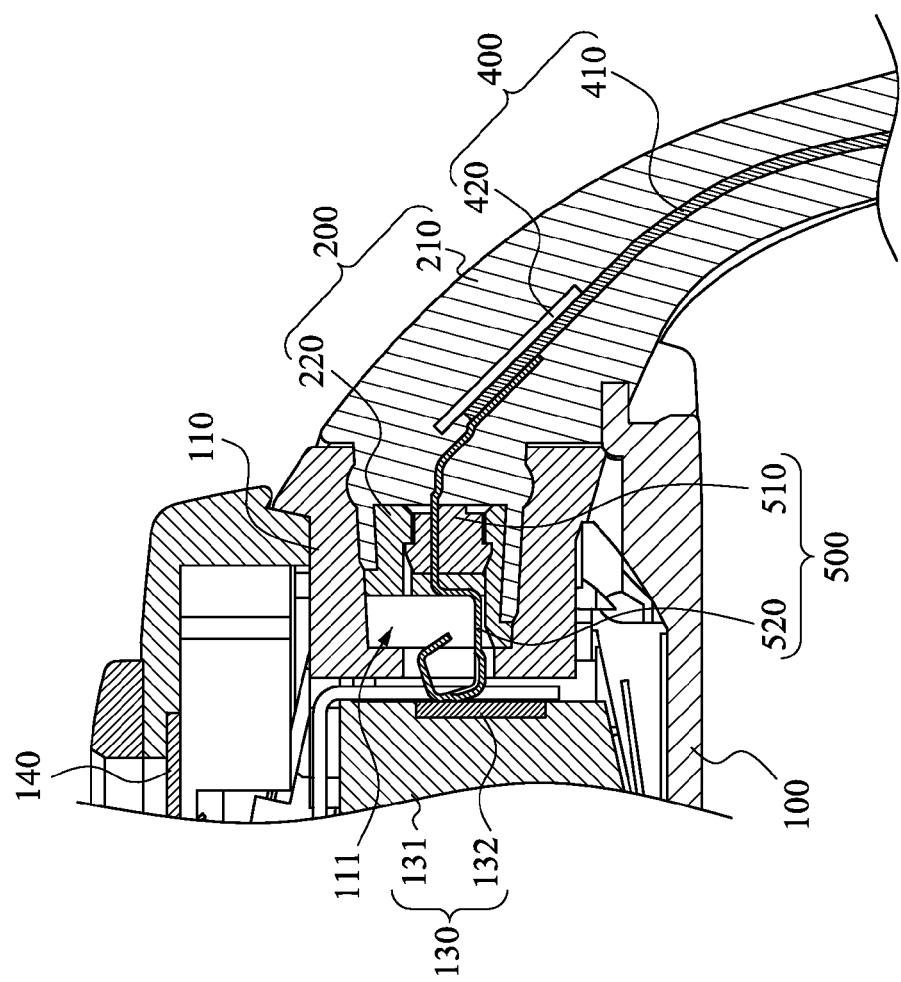
FIG. 2 is a cross-sectional view taken along line A-A of FIG. 1.

Reference is now made to FIG. 1 and FIG. 2 in which FIG. 1 is a perspective view of a wearable electronic device 10 according to an embodiment of this disclosure, and FIG. 2 is a cross-sectional view taken along line A-A of FIG. 1. As shown in FIG. 1 and FIG. 2, the wearable electronic device 10 includes a device body 100, a wearing unit (e.g., a first watchband 200 and a second watchband 300), an antenna module 400 and a conductive unit 500. The device body 100 is provided with a wireless communication module 130. The wearing unit (e.g., the first watchband 200) is connected to the device body 100. For example, the wearing unit is detachably connected to the device body 100. The antenna module 400 is entirely embedded inside the wearing unit (e.g., the first watchband 200). The conductive unit 500 is partially embedded inside the wearing unit and electrically connected to the antenna module 400 and the wireless communication module 130.

Figure 3:
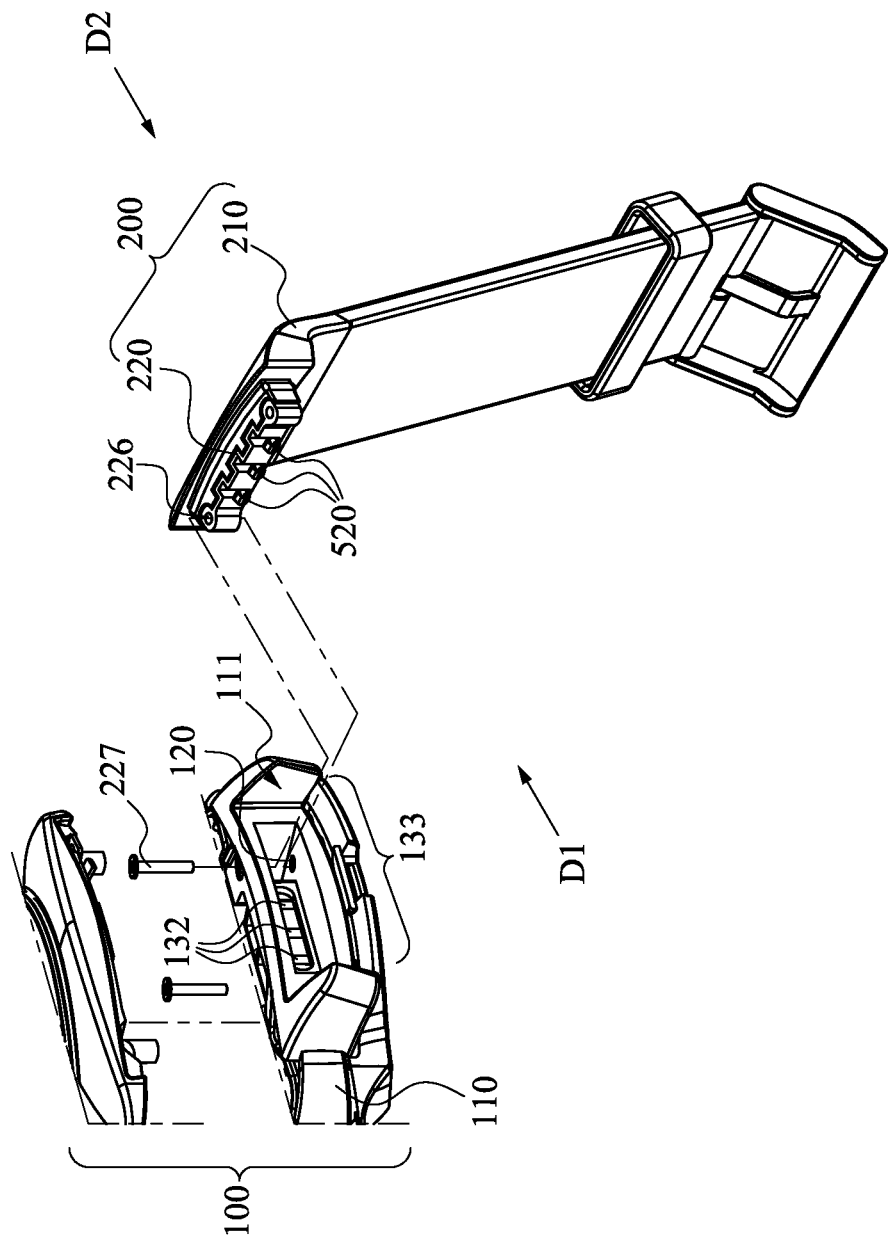
FIG. 3 is a partial exploded view of FIG. 1.

FIG. 3 is a partial exploded view of FIG. 1. As shown in FIG. 2 and FIG. 3, for example, when the wearable electronic device 10 is a digital watch, the device body 100 is a caliber of the digital watch, the wearing unit includes the first watchband 200 and the second watchband 300, and the first watchband 200 and the second watchband 300 are respectively installed on two opposites sides of the device body 100 (FIG. 1). In great details, the device body 100 includes a shell 110 having a recess 111, and the wireless communication module 130 includes a circuit board 131 and a plurality of terminals 132. The terminals 132 are abreast arranged on the circuit board 131 at intervals, and the terminals 132 are respectively exposed outwards from the recess 111 of the shell 110 so as to form a first conductive interface 133.

The shell 110 is provided with a first installation portion 120 at an outer surface thereof. The first installation portion 120 is disposed in the recess 111 of the shell 110. The first watchband 200 includes a wearing member 210 and a connection portion 220 connected to the wearing member 210 and the device body 100 (e.g., caliber). One part of the connection portion 220 is embedded inside one end portion of the wearing member 210, and the other part of the connection portion 220 is exposed outwards from the end portion of the wearing member 210.

The antenna module 400 includes an antenna unit 410 and a flexible wired board 420. Both of the antenna unit 410 and the flexible wired board 420 are entirely embedded (i.e., buried) in the wearing member 210 of the first watchband 200, and the antenna unit 410 is electrically connected to the flexible wired board 420 and the conductive unit 500.

Figure 4A:
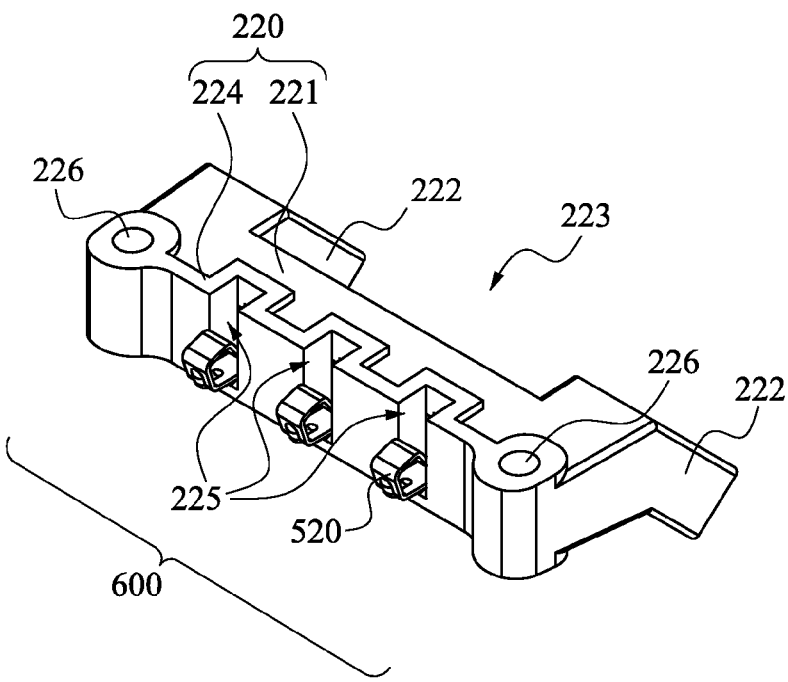
FIG. 4A is a schematic view of the connection portion and the conductive unit viewed along a first direction of FIG. 3.

FIG. 4A is a schematic view of the connection portion 220 and the conductive unit 500 viewed along a first direction D1 of FIG. 3. As shown in FIG. 3 and FIG. 4A, the connection portion 220 includes a first part 221 and a second part 224. The first part 221 is embedded (i.e., buried) in the end portion of the wearing member 210 (FIG. 2). The second part 224 extends and is exposed outwards from the end portion of the wearing member 210 (FIG. 2), and the second part 224 is fixedly fastened to the device body 100, for example, the second part 224 includes a second installation portion 226.

Thus, after the connection portion 220 is extended into the recess 111 of the shell 110, by securing the second installation portion 226 on the first installation portion 120 through fixed bolts 227, the connection portion 220 is then assembled on the device body 100, at the mean time, the conductive unit 500 is electrically connected to the terminals 132 of the wireless communication module 130 in the recess 111. The second watchband 300 is also assembled on the device body 100 by the similar method that the first watchband 200 is assembled on the device body 100. Since the details of the second watchband 300 for being assembled on the device body 100 is the same as that of the first watchband 200 for being assembled on the device body 100, the structure and the method of the second watchband 300 for being assembled on the device body 100 are no longer to be described hereinafter. Therefore, the wearable electronic device 10 can be worn on a user by the first watchband 200 and the second watchband 300.

However, It is noted, the disclosure is not limited thereto, in another embodiment, the wearable unit also can be a single watchband (e.g., an elastic band or a bracelet), not two separated watchbands; the antenna unit also can be one of circuit boards or antenna chips; or/and the shell also can be metallic shell or nonmetallic shell.

Figure 4B:
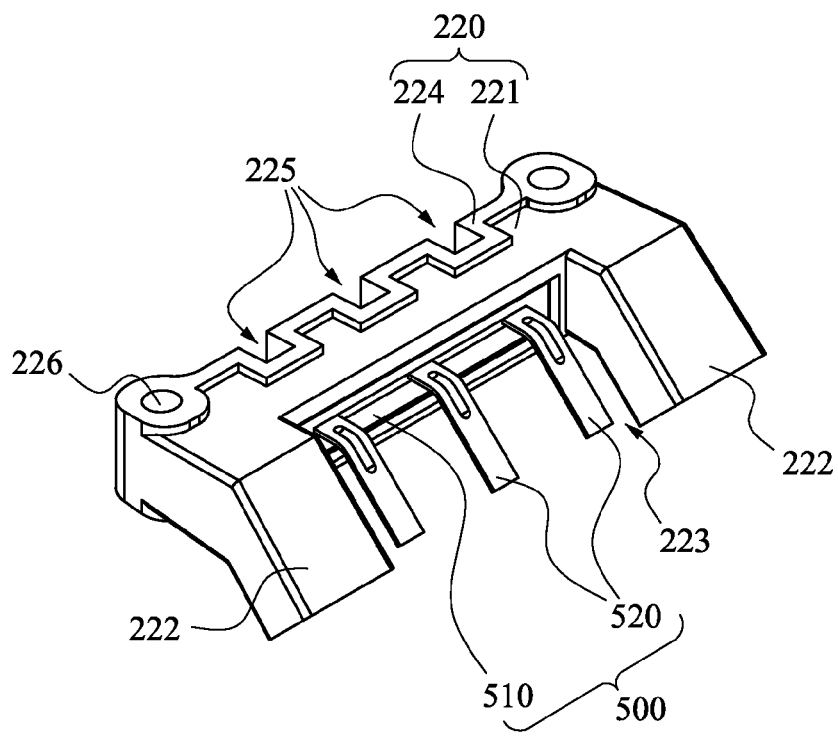
FIG. 4B is a schematic view of the connection portion and the conductive unit viewed along a second direction of FIG. 3.

FIG. 4B is a schematic view of the connection portion 220 and the conductive unit 500 viewed along a second direction D2 of FIG. 3. As shown in FIG. 4A and FIG. 4B, the first part 221 of the connection portion 220 further is provided with two extending ribs 222, the extending ribs 222 are used for being embedded (i.e., buried) in the end portion of the wearing member 210 (FIG. 3). An opening 223 is formed between the extending ribs 222. The second part 224 of the connection portion 220 further is provided with a plurality of slots 225. The slots 225 are abreast arranged at intervals, and exposed outwards from the end portion of the wearing member 210 (FIG. 3).

Figure 5:
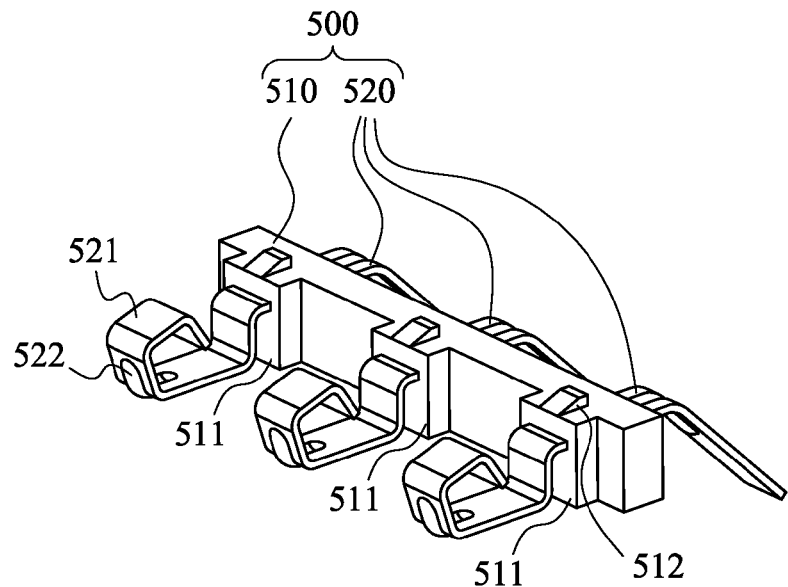
FIG. 5 is a schematic view of the conductive unit viewed through the connection portion of FIG. 4A.

FIG. 5 is a schematic view of the conductive unit viewed through the connection portion of FIG. 4A. As shown in FIG. 4B and FIG. 5, the conductive unit 500 includes a support body 510 and a plurality of metallic elastic pieces 520. The support body 510 is entirely embedded inside the connection portion 220, and the metallic elastic pieces 520 are respectively extended outwards from the connection portion 220 via the slots 225 to mutually form a second conductive interface 600 (FIG. 4A). Thus, after the connection portion 220 inserts into the recess 111 of the shell 110 to secure the wearing unit (e.g., a first watchband 200 and a second watchband 300) on the device body 100, the first conductive interface 133 is exactly electrically connected with the second conductive interface 600, that is, the metallic elastic pieces 520 respectively elastically contacts with the terminals 132 of the wireless communication module 130 in the recess 111 of the shell 110. Also, one end of each of the metallic elastic pieces 520 for contacting with the terminal 132 is provided with a curve portion 521. The outer surface of the curve portion 521 is formed with a contacting bump 522. The contacting bump 522 is used to point contact with the terminal 132 of the wireless communication module 130.

Furthermore, the support body 510 is provided with a plurality of separation portions 511. The metallic elastic pieces 520 are fixedly embedded in the support body 510, and the metallic elastic pieces 520 are abreast arranged on the support body 510 at intervals so as to be electrically isolated by the support body 510. Furthermore, the support body 510 is further provided with grabbing flanges 512. The grabbing flanges 512 facilitate the support body 510 to be further fixed in the connection portion 220.

In one optional embodiment of the disclosure, refer to FIG. 2, after the metallic elastic pieces 520 are installed in the support body 510 to be the conductive unit 500, the conductive unit 500 can be wrapped and embedded (i.e., buried) in the connection portion 220 by an insert injection molding method so as to be fixed in the connection portion 220. Similarly, after the conductive unit 500 is installed in the connection portion 220, the connection portion 220 including the conductive unit 500 installed therein and the antenna module 400 can be wrapped and embedded (i.e., buried) in the wearing member 210 by an insert injection molding method so as to be fixed in the wearing member 210. It is noted, since the connection portion 220 is wrapped and embedded (i.e., buried) in the wearing member 210, the melting point of the connection portion 220 is greater than the melting point of the wearing member 210.

Thus, since the hardness of the connection portion 220 is greater than the hardness of the wearing member 210, comparing to the wearing member 210, the connection portion 220 for coupling to the device body 100 has greater structural strength for avoiding damage. On the other hand, since the hardness of the wearing member 210 is less than the hardness of the connection portion 220, comparing to the connection portion 220, the wearing member 210 has softer impression when being touched.

In one optional embodiment of the disclosure, the material of the connection portion 220 is not limited in the disclosure, for example, plastic material. The plastic material can be high-density polyethylene (PE), polypropylene (PP), acrylonitrile butadiene styrene (ABS), nylon or combinations thereof. The material of the wearing member 210 is not limited in the disclosure, for example, plastic material. The plastic material can be low-density polyethylene (PE), thermoplastic elastomer (TPR), polyvinyl chloride (PVC) or themoplastic polyurethane (TPU) or combinations thereof.

Figure 6:
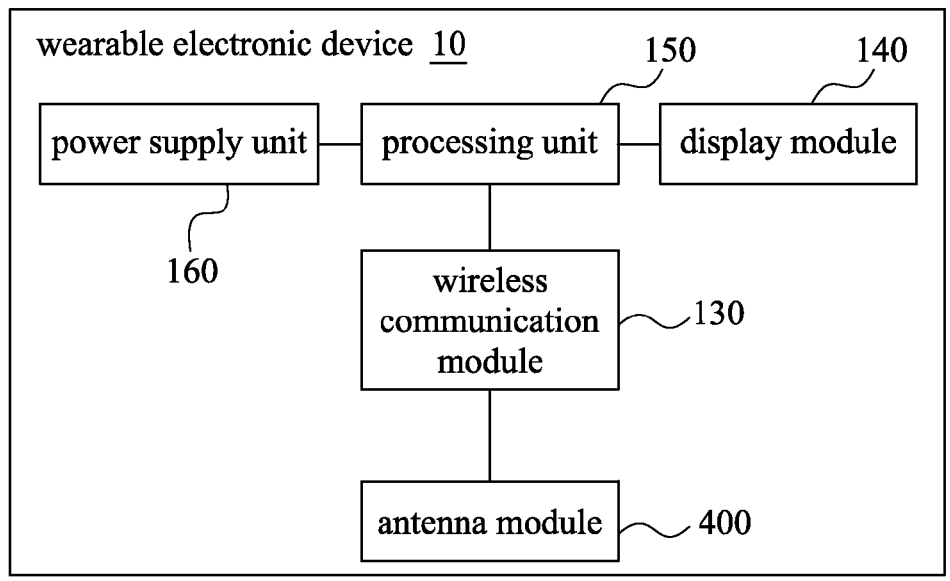
FIG. 6 is a block diagram illustrating the wearable electronic device according to one embodiment of this disclosure.

FIG. 6 is a block diagram illustrating the wearable electronic device 10 according to one embodiment of this disclosure. As shown in FIG. 1 and FIG. 6, the device body 100 further includes a display module 140. The display module 140 is electrically connected to the wireless communication module 130. The display module 140 is shown through from the topside of the shell 110, and disposed between the first watchband 200 and the second watchband 300. Thus, since the antenna module 400 is arranged to be apart from the shell 110 (or display module 140), the antenna module 400 cannot be interfered or shielded by the shell 110 (or display module 140) so as to avoid degrading the expected antenna efficiency of the antenna module 400.

Furthermore, the device body 100 further includes a processing unit 150 and a power supply unit 160. The processing unit 150 is electrically connected to the display module 140, the power supply unit 160 and the wireless communication module 130. Thus, after the antenna module 400 receives wireless information, the antenna module 400 transfers the wireless information to the wireless communication module 130. After the wireless communication module 130 processes the wireless information, the wireless communication module 130 sends the processed wireless information to the display module 140 so that the display module 140 displays the processed wireless information. The power supply unit 160 provides enough electric power to the processing unit 150, the display module 140 and the wireless communication module 130 mentioned above.

In the embodiments, the wearable electronic device 10 can be a digital watch, however, the disclosure is not limited thereto, and the wearable electronic device also can be a pair of glasses, a bracelet, a card hanger or a headphone. Furthermore, the wireless communication module 130 is a blue-tooth wireless communication module. However, the disclosure is not limited thereto, in another embodiment, the wireless communication module 130 also can be an infrared transmission module, a radio frequency identification (RFID) module, a WIFI network module or a near-field communication (NFC) module.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A wearable electronic device, comprising:
    a device body having a recess and a first installation portion disposed in the recess;
        a wireless communication module disposed in the device body, and exposed outwards from the recess;
        a wearing unit comprising:
            a plastic wearing member having an end portion thereof; and
            a plastic connection portion comprising two extending ribs and a second installation portion being opposite to the extending ribs and exposed outwards from the end portion of the plastic wearing member, wherein the extending ribs are embedded inside in the end portion of the plastic wearing member so as to form an opening between the extending ribs in the end portion of the plastic wearing member, and the second installation portion is detachably connected to the first installation portion, wherein a melting point of the plastic connection portion is greater than a melting point of the plastic wearing member;
        an antenna module entirely embedded inside the plastic wearing member; and
        a conductive unit comprising:
            a support body entirely embedded inside the plastic connection portion; and
            a plurality of metallic elastic pieces abreast arranged on the support body at intervals, and electrically connected to the antenna module in the opening,
            wherein, when the plastic connection portion enters the recess, and the second installation portion is connected to the first installation portion, the metallic elastic pieces elastically contact with terminals of the wireless communication module;
            wherein the plastic connection portion is provided with a plurality of slots, and the slots are abreast arranged at intervals and exposed outwards from the end portion of the plastic wearing member, and the metallic elastic pieces extend outwards from the plastic connection portion via the slots, respectively.

2. The wearable electronic device of claim 1, wherein a hardness of the plastic connection portion is greater than a hardness of the plastic wearing member.

3. The wearable electronic device of claim 1, wherein the device body comprises at least one metallic shell, and the wireless communication module is disposed in the metallic shell.

4. The wearable electronic device of claim 1, wherein the wearable electronic device is a digital watch, a pair of glasses, a bracelet, a card hanger or a headphone.

5. The wearable electronic device of claim 1, wherein the wearing unit is a wrist-worn band, and the antenna module comprises an antenna unit and a flexible wired board, the antenna unit is electrically connected to the flexible wired board and the conductive unit.

6. The wearable electronic device of claim 1, wherein the wireless communication module is a blue-tooth wireless communication module, an infrared transmission module, a radio frequency identification (RFID) module, a WIFI network module or a near-field communication (NFC) module.

7. A wearable electronic device, comprising:
    a device body having a recess and a first installation portion disposed in the recess;
    a wireless communication module disposed in the device body, and exposed outwards from the recess, wherein the wireless communication module is provided with a first conductive interface;
    a wrist-worn band comprising:
        a plastic wearing member having an end portion thereof;
        a plastic connection portion comprising two extending ribs and a second installation portion being opposite to the extending ribs and exposed outwards from the end portion of the plastic wearing member,
        wherein the extending ribs are embedded inside in the end portion of the plastic wearing member so as to form an opening between the extending ribs in the end portion of the plastic wearing member, and the second installation portion is detachably connected to the first installation portion, wherein a melting point of the plastic connection portion is greater than a melting point of the plastic wearing member; and
    a second conductive interface formed with a support body entirely embedded inside the plastic connection portion, and a plurality of metallic elastic pieces abreast arranged on the support body at intervals, and disposed in the opening; and
    an antenna module entirely embedded inside the plastic wearing member, and electrically connected to the metallic elastic pieces of the second conductive interface,
    wherein, when the plastic connection portion enters the recess, and the second installation portion is connected to the first installation portion, the metallic elastic pieces elastically contact with terminals of the wireless communication module;
    wherein the plastic connection portion is provided with a plurality of slots, the slots are abreast arranged at intervals, and exposed outwards from the end portion of the plastic wearing member, and the metallic elastic pieces extend outwards from the plastic connection portion via the slots, respectively.

8. The wearable electronic device of claim 7, wherein a hardness of the plastic connection portion is greater than a hardness of the plastic wearing member.

9. The wearable electronic device of claim 7, wherein the device body comprises at least one metallic shell, and the wireless communication module is disposed in the metallic shell.

10. The wearable electronic device of claim 7, wherein the wearable electronic device is a digital watch, a pair of glasses, a bracelet, a card hanger or a headphone.

11. The wearable electronic device of claim 7, wherein the wireless communication module is a blue-tooth wireless communication module, an infrared transmission module, a radio frequency identification (RFID) module, a WIFI network module or a near-field communication (NFC) module.

* * * * *